(12) United States Patent
Yeo et al.

(10) Patent No.: US 7,380,560 B2
(45) Date of Patent: Jun. 3, 2008

(54) WAFER CLEANING APPARATUS WITH PROBE CLEANING AND METHODS OF USING THE SAME

(75) Inventors: In-joon Yeo, Gyeonggi-do (KR); Il-sang Lee, Gyeonggi-do (KR); Kang-youn Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 701 days.

(21) Appl. No.: 10/843,173

(22) Filed: May 11, 2004

(65) Prior Publication Data
US 2004/0238000 A1 Dec. 2, 2004

(30) Foreign Application Priority Data
May 28, 2003 (KR) .................. 10-2003-0034105

(51) Int. Cl.
*B08B 3/12* (2006.01)
(52) U.S. Cl. .............. 134/184; 134/196; 134/201; 134/902
(58) Field of Classification Search ............ 134/1, 134/1.3, 42, 184, 198, 201, 902
See application file for complete search history.

(56) References Cited

U.S. PATENT DOCUMENTS

| | | | |
|---|---|---|---|
| 6,039,059 A | 3/2000 | Bran | 134/105 |
| 6,140,744 A * | 10/2000 | Bran | 310/346 |
| 6,843,257 B2 * | 1/2005 | Yeo et al. | 134/1.3 |
| 2002/0185152 A1 * | 12/2002 | Lauerhaas et al. | 134/1.3 |

FOREIGN PATENT DOCUMENTS

| | | |
|---|---|---|
| KR | 2003-48763 | 7/2000 |
| KR | 2002-0071249 | 9/2002 |
| KR | 2003-0014590 | 2/2003 |

\* cited by examiner

*Primary Examiner*—Joseph L. Perrin
*Assistant Examiner*—Joy Watson
(74) *Attorney, Agent, or Firm*—Myers Bigel Sibley & Sajovec

(57) ABSTRACT

Wafer cleaning apparatus include a cleaning tub configured to receive a wafer to be cleaned. A wafer cleaning unit coupled to the cleaning tub is configured to provide wafer cleaning solution to the wafer. A probe is positioned in the cleaning tub proximate the wafer. The probe is configured to provide megasonic vibrational energy to a surface of the wafer and/or the wafer cleaning solution to separate contaminants from the surface of the wafer. A probe cleaning unit is configured to provide a probe cleaning solution to the probe to clean the probe. Methods of using the wafer cleaning apparatus are also provided.

7 Claims, 5 Drawing Sheets

WAFER CLEANING APPARATUS WITH PROBE CLEANING AND METHODS OF USING THE SAME

RELATED APPLICATIONS

This application claims priority from Korean Patent Application No. 10-2003-0034105 filed on May 28, 2003, the disclosure of which is hereby incorporated herein by reference.

BACKGROUND OF THE INVENTION

The present invention relates to semiconductor wafer manufacturing and, more particularly, to cleaning of semiconductor wafers and the like.

A semiconductor wafer, such as those used to fabricate integrated circuit devices, is typically cleaned using a cleaning solution. High frequency, in particular, megasonic, energy may be applied to the cleaning solution. The megasonic energy may have a frequency about twenty (20) times higher than that of an ultrasonic wave that may be used to remove contaminants from the semiconductor wafer.

A megasonic energy cleaning apparatus typically includes a piezoelectric transducer connected to a transmitter. When the piezoelectric transducer is electrically excited and vibrated, the transmitter applies megasonic energy to the cleaning solution in a treating tank. The cleaning solution is agitated by the megasonic energy to cause contaminants to separate from a semiconductor wafer exposed to the cleaning solution. In other words, contaminants attached to a surface of the semiconductor wafer may be vibrated and separated from the surface of the semiconductor wafer by the megasonic energy.

A known type of "wafer cleaning system" using megasonic energy for cleaning is discussed in U.S. Pat. No. 6,039,059 ("the '059 patent"). Such a conventional wafer cleaning system is illustrated in FIGS. 1 to 3, which correspond to FIGS. 1-3 of the '059 patent. Accordingly, a detailed description of the conventional aspects of such a wafer cleaning system will not be presented herein and the '059 patent is incorporated herein by reference in its entirety, including the description therein corresponding to FIGS. 1-3 of the present specification.

Research has been conducted to improve the conventional wafer cleaning system using a megasonic energy cleaning technique or a cavitation phenomenon. However, various limitations have been observed in such research. For example, in a wafer cleaning system having a probe for applying megasonic energy, the probe is generally not cleaned in use, as the probe is withdrawn from a cleaning tub after applying megasonic energy into a cleaning solution in the tub and is removed from the cleaning tub without being cleaned before a subsequent semiconductor wafer is cleaned. If the wafer cleaning system is operated for a long time, contaminants removed from the semiconductor wafer may gather in the probe and the contaminants collected in the probe may re-contaminate a surface of the subsequently cleaned semiconductor wafer during the cleaning operation.

SUMMARY OF THE INVENTION

Embodiments of the present invention provide wafer cleaning apparatus including a cleaning tub configured to receive a wafer to be cleaned. A wafer cleaning unit coupled to the cleaning tub is configured to provide wafer cleaning solution to the wafer. A probe is positioned in the cleaning tub proximate the wafer. The probe is configured to provide megasonic vibrational energy to a surface of the wafer and/or the wafer cleaning solution to separate contaminants from the surface of the wafer. A probe cleaning unit is configured to provide a probe cleaning solution to the probe to clean the probe.

In other embodiments of the present invention, the wafer cleaning apparatus includes a piezoelectric transducer connected to a portion of the probe displaced from the wafer to vibrate the probe so that it generates the megasonic vibrational energy. The probe may be a rod-shaped probe and may have an uneven surface on a portion thereof facing the wafer. The apparatus may further include a probe storing tub configured to receive and store the probe. The probe storing tub is positioned proximate the cleaning tub.

In further embodiments of the present invention, the probe is movable between a position in the cleaning tub proximate the wafer to a position at least partially withdrawn from the cleaning tub. The probe cleaning unit may be positioned in the cleaning tub to clean the probe while the probe is moving between these positions. A drying unit may be provided positioned proximate the probe cleaning unit to dry the probe during and/or after cleaning by the probe cleaning unit. The probe in some embodiments is movable between a position in the cleaning tub proximate the wafer to a position in the probe storing tub and the probe cleaning unit may be positioned in the probe storing tub to clean the probe while the probe is moving between the cleaning tub and the probe storing tub.

In other embodiments of the present invention, the probe is positioned in the cleaning tub and the apparatus further includes a spattering reduction member positioned in the cleaning tub opposite an outlet of the probe cleaning unit with the probe passing therebetween. The spattering reduction member is configured to limit (reduce) splatter from the probe onto the wafer during cleaning of the probe. In other embodiments, a drying unit is positioned in the cleaning tub opposite an outlet of the probe cleaning unit to dry the probe after it is cleaned by the probe cleaning unit and to limit splatter from the probe onto the wafer during cleaning of the probe.

In further embodiments of the present invention, the probe has an uneven surface on a portion thereof facing the wafer. The probe cleaning unit in such embodiments is positioned with the probe between the probe cleaning unit and the wafer and the probe is configured to rotate the uneven surface toward the probe cleaning unit during cleaning of the probe.

In other embodiments of the present invention, the probe is a quartz probe. The probe cleaning solution may include hydrofluoric acid and/or deionized water and the probe may be sapphire, silicon carbide and/or boron nitride or may be quartz coated with silicon carbide and/or vitreous carbon. The wafer cleaning solution may be pure water, ultra-pure water, hydrogenated water, ozonized water, a dilute hydrofluoric acid solution and/or a surfactant solution.

In further embodiments of the present invention, wafer cleaning methods are provided including positioning a wafer in a cleaning tub of a wafer cleaning apparatus. A probe is positioned above and proximate the wafer. A wafer cleaning solution is provided between the probe and the wafer. The probe is vibrated to apply megasonic energy to the wafer cleaning solution and/or the wafer to separate contaminants from the wafer. The probe is cleaned with a probe cleaning solution while moving the probe relative to the wafer following cleaning of the wafer.

In other embodiments of the present invention, the probe is a rod-shaped probe and the wafer cleaning solution fills up a gap between the probe and the wafer. Cleaning the probe may include cleaning the probe with a probe cleaning solution while withdrawing the probe from the cleaning tub. The method may further include drying the probe after cleaning the probe with a probe cleaning solution. Cleaning the probe may include cleaning the probe while megasonic energy is applied to the probe.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
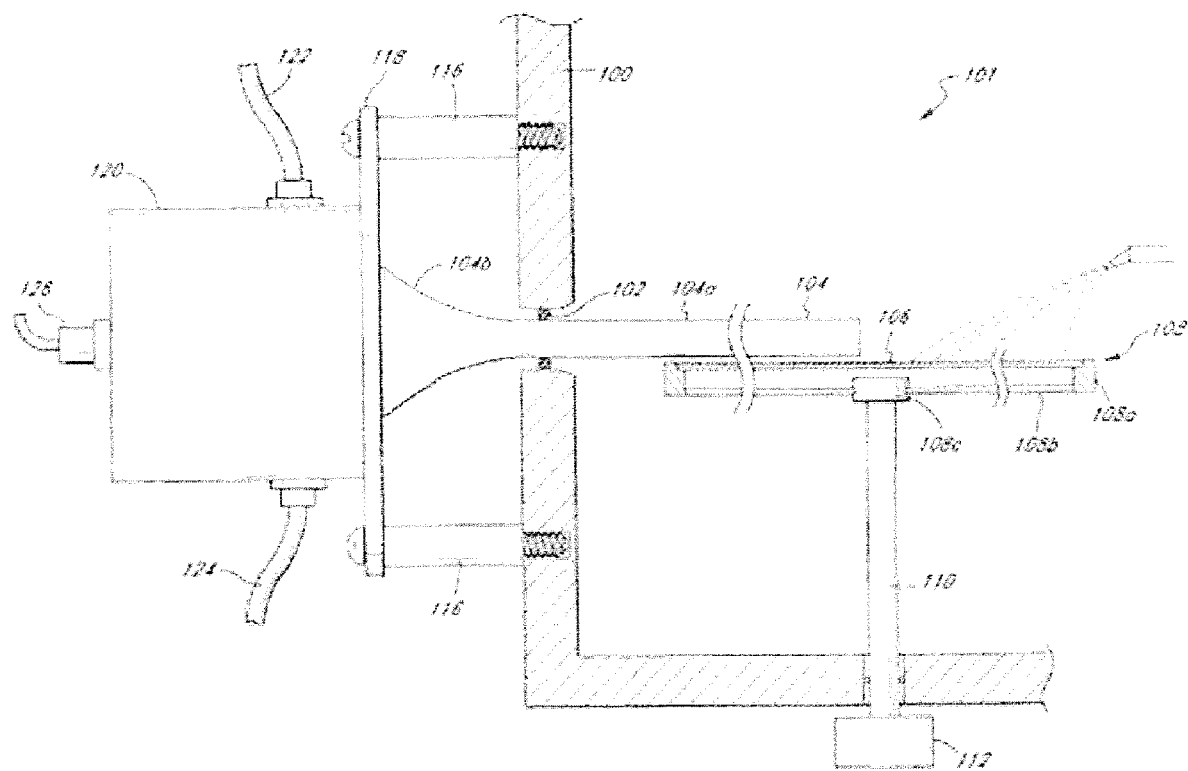
FIGS. 1 and 2 are cross-sectional views illustrating a conventional apparatus for cleaning wafers.
Figure 2:
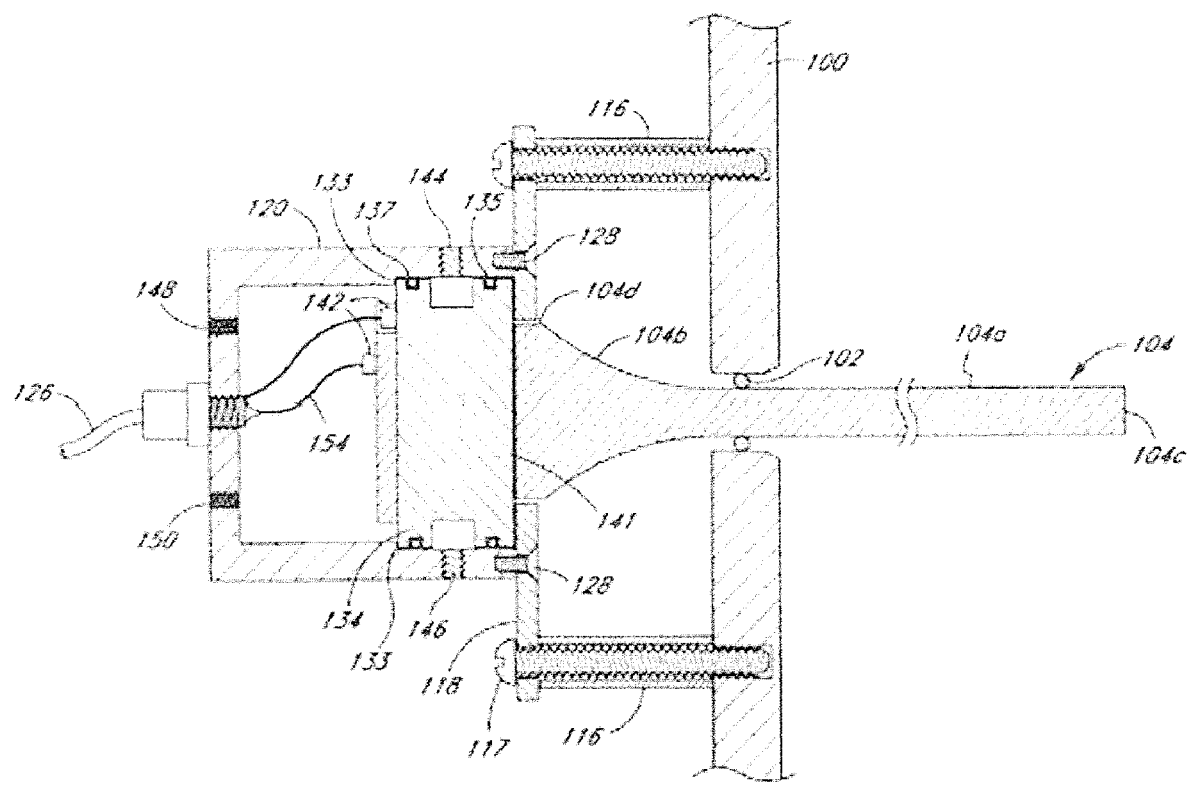
Figure 3:
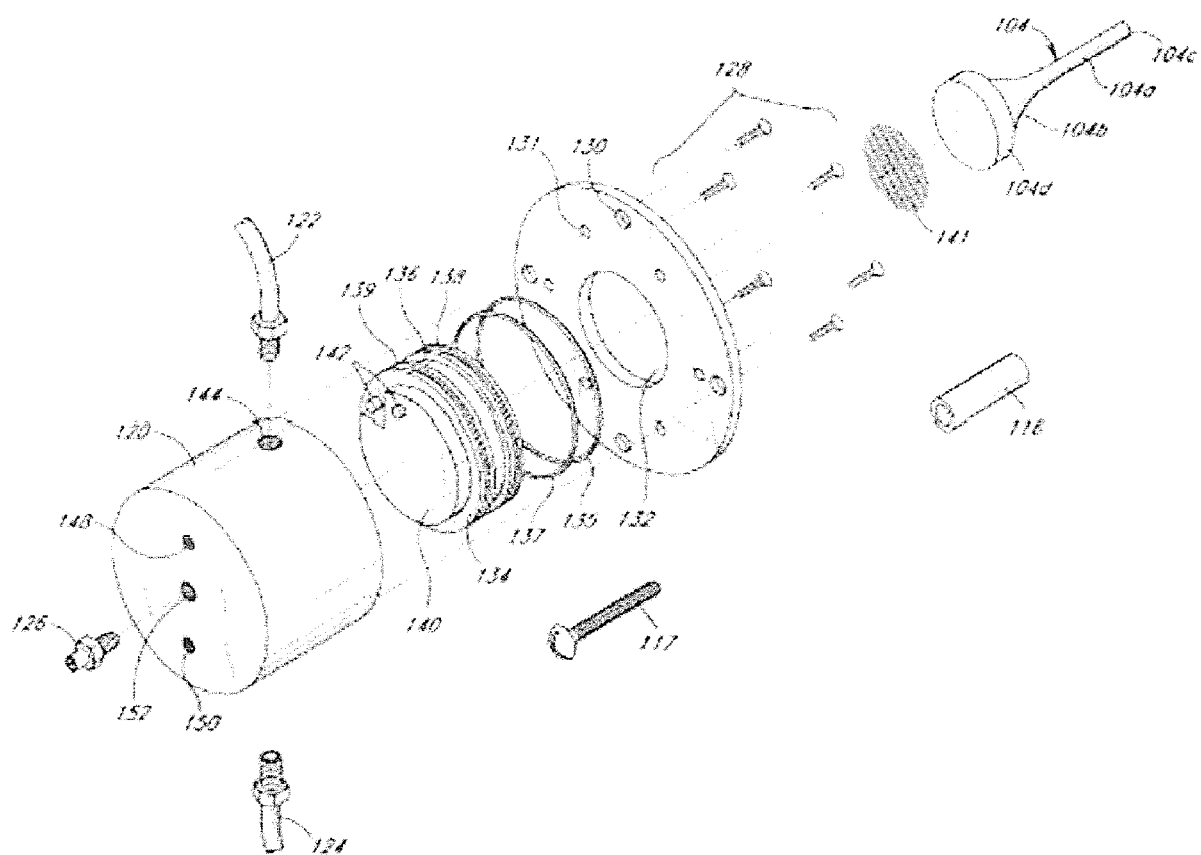
FIG. 3 is an exploded perspective view illustrating the apparatus of FIGS. 1 and 2.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element is referred to as being "attached", "connected" or "coupled" to another element, it can be directly connected or coupled to the other element or intervening elements may be present. In contrast, when an element is referred to as being "directly attached," "directly connected" or "directly coupled" to another element, there are no intervening elements present. Like numbers refer to like elements throughout the specification. As used herein the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure.

Various embodiments of the present invention for cleaning wafers will now be described with reference to the cross-sectional schematic view illustrations of FIGS. 4 to 6. The embodiments of the present invention illustrated in FIG. 4 include a cleaning tub 100 for receiving a semiconductor wafer 110 to be cleaned. A probe 104, which may be rod-shaped, applies vibration energy to the semiconductor wafer 110 to separate contaminants from a surface of the semiconductor wafer 110. A piezoelectric transducer 204 acoustically connected to a rear part of the probe 104 vibrates the probe 104. The cleaning system shown in FIG. 4 further includes a probe cleaning unit 215 and a probe storing tub 200 where the probe 104 may be moved between wafer cleaning cycles.

A wafer chuck 120 maintains the semiconductor wafer 110 in a horizontal orientation and rotates the semiconductor wafer 110 during cleaning after the semiconductor wafer 110 is positioned in the cleaning tub 100. An opening formed on a lateral side of the cleaning tub 100 allows linear movement of the probe 104 in parallel with the semiconductor wafer 110 as shown by the arrow in FIG. 4 between positions in the cleaning tub 100 proximate the wafer 110 and a retracted position in the probe storing tub 200. As shown in solid line in FIGS. 4-6, the probe is intermediate these positions.

In some embodiments of the present invention, the probe 104 is made of quartz or a relatively inert non-contaminated material capable of effectively transporting acoustic energy therethrough. A quartz probe 104 may generally be used in most cleaning solutions, although a cleaning solution containing hydrofluoric acid may etch quartz. In other embodiments of the present invention, the probe may be made of sapphire, silicon carbide, boron nitride or the like instead of quartz. In yet further embodiments of the present invention, a probe made of quartz coated with a material selected to endure exposure to hydrofluoric acid, such as silicon carbide or vitreous carbon, may be used.

Examples of suitable wafer cleaning solutions to be provided from a wafer cleaning unit 210 to a surface of the semiconductor wafer 110 include pure water, ultra-pure water, hydrogenated water, ozonized water, a dilute hydrofluoric acid solution and/or a surfactant solution.

Figure 4:
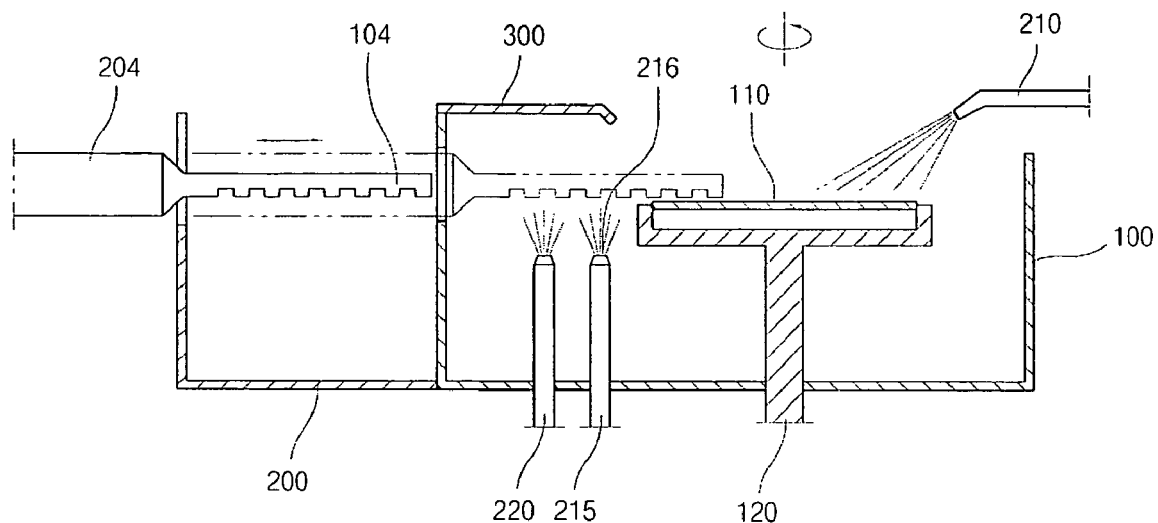
FIGS. 4 to 6 are cross-sectional schematic views illustrating some embodiments of an apparatus for cleaning wafers according to the present invention.

As illustrated in the embodiments of FIG. 4, the probe 104 includes a cleaning portion and the rear portion. The cleaning portion of the probe 104 is positioned proximate the semiconductor wafer 110 and the rear portion of the probe 104 is connected to a piezoelectric transducer 204. In cross-section, the probe 104 may, at least in part, be circular and the cleaning portion of the probe 104 may be smaller in diameter than the rear portion of the probe 104, which may provide more effective concentration of vibration energy during cleaning. Furthermore, the probe 104 may be a cylinder with a constant diameter, and the probe 104 may be non-circular in cross-section.

The cleaning portion of the probe 104 in some embodiments of the present invention has a length sufficient to expose a whole surface of the semiconductor wafer 110 to the probe 104 during cleaning of the semiconductor wafer 110. In other words, the length of the cleaning portion of the probe 104 is long enough about axle 120 to expose the center of the semiconductor wafer 110, which rotates under the cleaning portion of the probe 104, to the probe 104.

As shown in the embodiments of FIG. 4, a lower side of the cleaning part of the probe 104 may be uneven (e.g., toothed, roughened, notched or the like). When the lower side of the probe 104 is uneven, megasonic energy with a predetermined sound wave range may be scattered between the cleaning solution and the uneven surface of the probe 104, which may reduce or prevent damage to the semiconductor wafer 110.

When electrically excited, the piezoelectric transducer 204 of FIG. 4 vibrates at a high frequency to excite the probe 104. The vibration energy is transported (transmitted) from the piezoelectric transducer 204 through the rear portion of the probe 104 to the rest of the probe 104. The probe 104 thereby operates to transport high frequency energy to the wafer cleaning solution between the probe 104 and the semiconductor wafer 110. In other words, the rear portion with a larger diameter receives the large transducer and the cleaning portion with a smaller diameter operates to concentrate the megasonic vibration energy in a small space to separate the contaminants from the semiconductor wafer 110. Thus, the vibration energy may be efficiently transported through the cleaning solution between the probe 104 and the semiconductor wafer 110 to clean the surface of the semiconductor wafer 110. In detail, the meagasonic vibration energy of the probe 104 may be transmitted to the wafer 110 through contact of the probe 104 with a layer of the wafer cleaning solution formed on the surface of the Wafer 110 by spraying the wafer cleaning solution on the surface of the wafer 110.

As the surface of the semiconductor wafer 110 is positioned close to the probe 104, the contaminants may be separated and removed from the surface of the semiconductor wafer 110 by agitating the wafer cleaning solution between the semiconductor wafer 110 and the probe 104. The contaminants separated from the surface of the semiconductor wafer 110 are discharged along with the flowing wafer cleaning solution.

The probe storing tub 200 for storing the probe 104 is positioned beside the cleaning tub 100. The probe 104 may be retracted from the cleaning tub 100 through the opening formed on side wall of the cleaning tub 100 into the probe storing tub 200 along an axis that is generally parallel with the surface of the semiconductor wafer 110, as shown by the arrow of FIG. 4. The probe 104 may be retracted to ease installation and removal of the semiconductor wafer 110 without interference from the probe 104.

The wafer cleaning solution provided from the wafer cleaning unit 210 and contaminants separated from the surface of the semiconductor wafer 110 may remain on the uneven surface of the probe 104 (i.e., the surface facing the wafer) after the completion of the cleaning process of the wafer. As a result, the contaminants remaining on the probe may contaminate subsequently cleaned semiconductor wafers 110 during the subsequent wafer cleaning processes. Accordingly, as shown for the embodiments of FIG. 4, a probe cleaning unit 215 is positioned in the cleaning tub 100 to clean contaminants remaining on the uneven surface of probe 104 as the probe 104 is withdrawn from the cleaning tub 100 after cleaning of the semiconductor wafer 110 and/or when the probe 104 is moved into the cleaning tub 100 to clean the semiconductor wafer 110 (i.e., moved between the respective positions).

In the embodiments of FIG. 4, the probe cleaning unit 215 is positioned under the probe 104 to spray a probe cleaning solution on the probe 104. The probe cleaning solution is provided through a shower nozzle 216 or other outlet in the probe cleaning unit 215 to the probe 104. A spattering reduction member 300 may be integrated with the cleaning tub 100 and installed over the probe cleaning unit 215 opposite an outlet in the probe cleaning unit 215 that dispenses probe cleaning solution to the probe. The spattering reduction member 300 may prevent the probe cleaning solution from spattering outside the cleaning tub 100 or onto the semiconductor wafer 110.

Alternatively, the shower nozzle 216 of the probe cleaning unit 215 may be positioned close to the probe 104 and the probe cleaning solution may be dispensed from the shower nozzle 216 of the probe cleaning unit 215 without spraying to clean the uneven surface of the probe 104 without spattering the probe cleaning solution. A range of sizes of the shower nozzle 216 may be used and, in some embodiments of the present invention, a distance between the probe 104 and the shower nozzle 216 is about 5 mm. Such a positioning may prevent the probe cleaning solution from spattering. Deionized water may be used as the probe cleaning solution provided through the probe cleaning unit 215.

As also shown in FIG. 4, a drying unit 220 may be positioned in the cleaning tub 100 to blow an inert gas toward the cleaned probe 104 to dry the cleaned probe 104. The drying unit 220 may be located proximate the probe cleaning unit 215 as shown in FIG. 4. The inert gas for drying may be, for example, nitrogen gas.

Alternatively, the drying unit 220 may be positioned above the probe cleaning unit 215 to direct the inert gas toward the probe 104. Such a configuration may further prevent the probe cleaning solution from spattering outside the cleaning tub 100 or onto the semiconductor wafer 110 without using the spattering reduction member 300. In other words, the positioning of the drying unit 220 in FIG. 5 may be combined with the positioning of the probe cleaning unit 215 in FIG. 4, with the two units generally aligned and directed toward each other. Furthermore while a single nozzle is illustrated for each of the drying unit 220 and the probe cleaning unit 215 in FIG. 4, two or more nozzles may be included.

Figure 5:
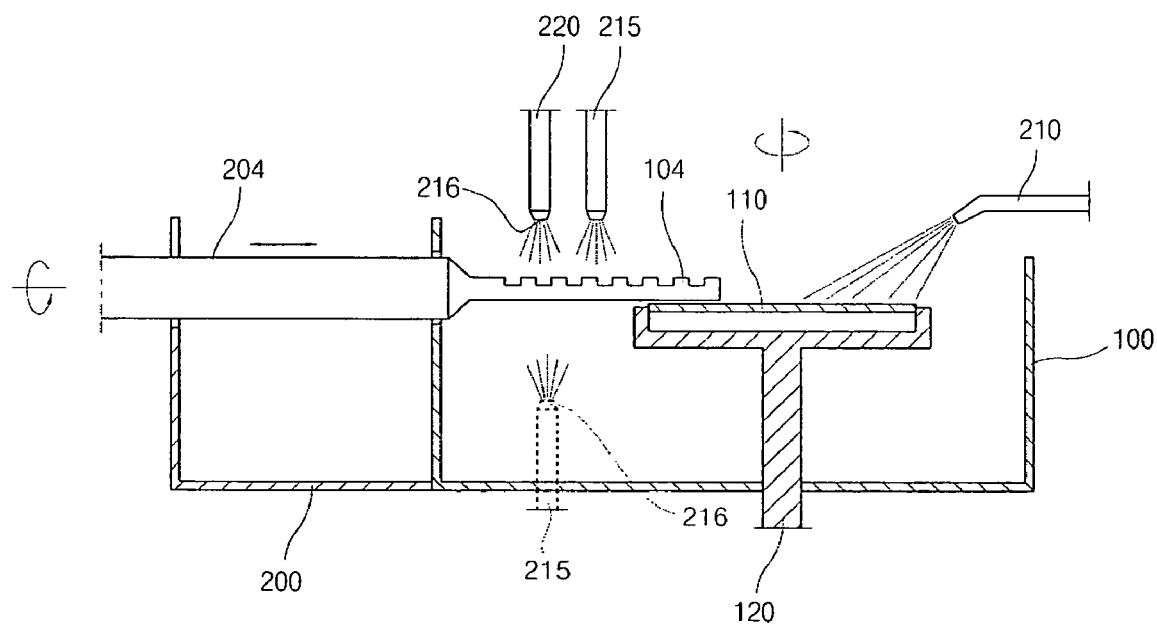

Further embodiments of the apparatus for cleaning wafers of the present invention are illustrated in FIG. 5. The embodiments illustrated in FIG. 5 may have generally the same structure as that of the embodiments as shown in FIG. 4 except as will be described herein. For the embodiments of FIG. 5, a probe cleaning unit 215 for providing a probe cleaning solution to a probe 104 is located above the probe 104. The probe cleaning solution is provided through a shower nozzle 216 to the probe 104. The configuration of the embodiments of FIG. 5 may prevent the probe cleaning solution from spattering outside the cleaning tub 100 or onto the semiconductor wafer 110 without using a spattering reduction member 300.

When an uneven surface positioned on a lower side of the probe 104 is cleaned, the probe 104 may be rotated in such a way that the uneven surface of the probe 104 is positioned at the highest point (i.e., facing upwardly as illustrated in FIG. 5). In addition, a drying unit 220 may be positioned in the cleaning tub 100 to blow an inert gas towards the cleaned probe 104 to dry the cleaned probe 104. As shown in FIG. 5, the drying unit 220 is positioned proximate the probe cleaning unit 215 during cleaning of the probe 104. The inert gas may be, for example, nitrogen gas.

Figure 6:
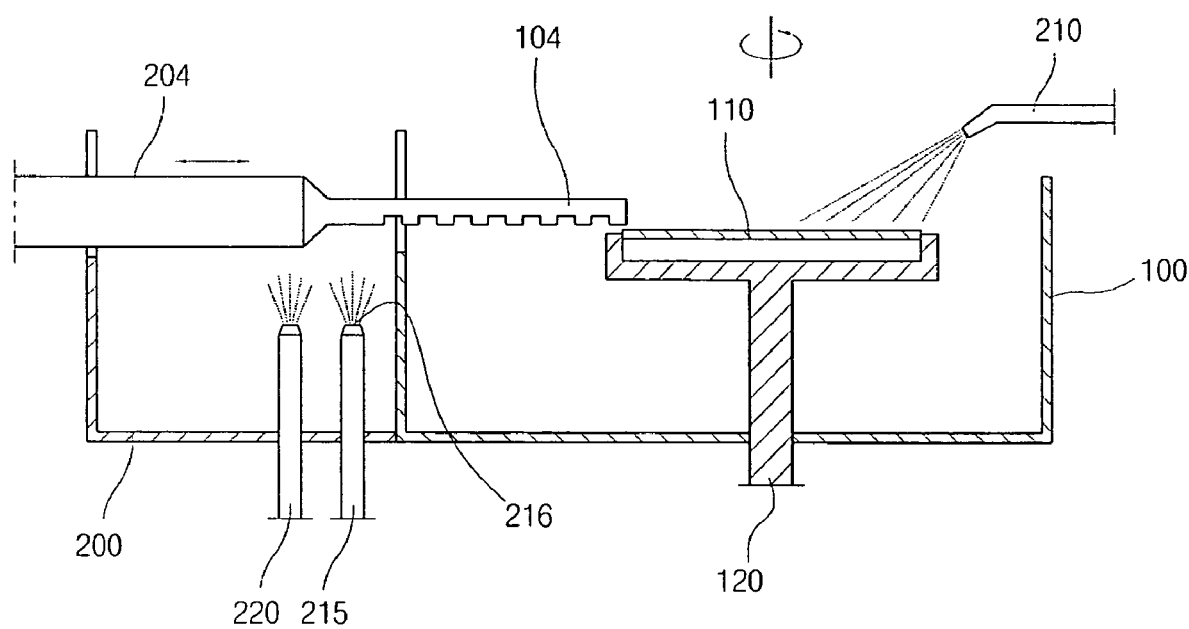

Yet further embodiments of an apparatus for cleaning a wafer are illustrated in FIG. 6. The embodiments illustrated in FIG. 6 may have generally the same structure as that of the embodiments as shown in FIGS. 4 and 5 except as will be described herein. For the embodiments of FIG. 6, a probe cleaning unit 215 and a drying unit 220 are installed in a probe storing tub 200, rather than the cleaning tub 100, to clean the contaminants remaining on an uneven surface of a probe 104 when the probe 104 is retracted from the cleaning tub 100 after the probe 104 cleans a semiconductor wafer 110 and/or when the probe 104 is moved into the cleaning tub 100 to clean the semiconductor wafer 110, without spattering of a probe cleaning solution onto the semiconductor wafer 110.

Embodiments of methods for cleaning the semiconductor wafer 110 using the cleaning apparatus described above will now be described. The semiconductor wafer 110 is placed on the wafer chuck 120. After insertion of the semiconductor wafer 110, the rod-shaped probe 104 is moved into the cleaning tub 100 in Such a way that the probe 104 is positioned proximate and above the semiconductor wafer 110. The wafer cleaning solution is provided between the probe 104 and the semiconductor wafer 110 in such a way that the wafer cleaning solution fills up a gap (space) between the probe 104 and the semiconductor wafer 110. The probe 104 is vibrated to apply megasonic energy to the wafer cleaning solution so as to separate contaminants from the semiconductor wafer 110.

After cleaning of the semiconductor wafer 110, the probe cleaning solution is provided to the probe 104 while the probe 104 is moved away from the semiconductor wafer 110. After the probe cleaning solution is provided to the probe 104 to clean the probe 104, the probe 104 may be dried using, for example, an inert gas such as a nitrogen gas. In some embodiments of the present invention, the probe 104 is cleaned and/or dried while megasonic energy is applied to the probe 104.

As described above, the present invention provides apparatus and methods of cleaning a semiconductor wafer. The apparatus and methods may advantageously clean a probe after the probe is used to clean a semiconductor wafer. Such probe cleaning may reduce or prevent negative affects that could be introduced by the probe during a subsequent wafer cleaning process.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A wafer cleaning apparatus, comprising:
   a cleaning tub configured to receive a wafer to be cleaned;
   a wafer cleaning unit coupled to the cleaning tub configured to provide wafer cleaning solution to the wafer;
   a probe positioned in the cleaning tub proximate the wafer, the probe being configured to provide megasonic vibrational energy to a surface of the wafer and/or the wafer cleaning solution to separate contaminants from the surface of the wafer;
   a probe cleaning unit that is configured to provide a probe cleaning solution to the probe to clean the probe; and
   a probe storing tub configured to receive and store the probe, the probe storing tub being positioned proximate the cleaning tub,
   wherein the probe is movable between a position in the cleaning tub proximate the wafer and a position in the probe storing tub and wherein the probe cleaning unit is positioned in the probe storing tub to clean the probe while the probe is moving between the cleaning tub and the probe storing tub.

2. The apparatus of claim 1 further comprising a probe drying unit that dries the probe after it is cleaned by the probe cleaning unit.

3. The apparatus of claim 2 wherein the probe has an uneven surface on a portion thereof facing the wafer.

4. The apparatus of claim 2 wherein the probe has an uneven surface on a portion thereof facing the wafer and wherein the probe is configured to rotate the uneven surface toward the probe cleaning unit during cleaning of the probe.

5. The apparatus of claim 2 wherein the probe comprises a quartz probe.

6. The apparatus of claim 2 wherein the probe comprises at least one of sapphire, silicon carbide and/or boron nitride.

7. The apparatus of claim 2 wherein the probe comprises quartz coated with silicon carbide and/or vitreous carbon.

* * * * *